(12) United States Patent
Chandrasekharan et al.

(10) Patent No.: US 12,209,312 B2
(45) Date of Patent: Jan. 28, 2025

(54) TEMPERATURE CONTROL OF A MULTI-ZONE PEDESTAL

(71) Applicant: LAM RESEARCH CORPORATION, Fremont, CA (US)

(72) Inventors: Ramesh Chandrasekharan, Lake Oswego, OR (US); Michael Philip Roberts, Tigard, OR (US); Aaron Bingham, Sherwood, OR (US); Ashish Saurabh, Portland, OR (US); Adrien Lavoie, Newberg, OR (US); Pulkit Agarwal, Beaverton, OR (US); Ravi Kumar, Beaverton, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 601 days.

(21) Appl. No.: 17/620,552

(22) PCT Filed: Jun. 22, 2020

(86) PCT No.: PCT/US2020/038874
§ 371 (c)(1),
(2) Date: Dec. 17, 2021

(87) PCT Pub. No.: WO2020/263719
PCT Pub. Date: Dec. 30, 2020

(65) Prior Publication Data
US 2022/0243332 A1    Aug. 4, 2022

Related U.S. Application Data

(60) Provisional application No. 62/865,621, filed on Jun. 24, 2019.

(51) Int. Cl.
*C23C 16/458* (2006.01)
*C23C 16/46* (2006.01)
*C23C 16/52* (2006.01)

(52) U.S. Cl.
CPC .......... *C23C 16/46* (2013.01); *C23C 16/4581* (2013.01); *C23C 16/52* (2013.01)

(58) Field of Classification Search
CPC ...... C23C 16/4581; C23C 16/46; C23C 16/52
(Continued)

(56) References Cited

U.S. PATENT DOCUMENTS 5,667,622 A    9/1997    Hasegawa et al.
6,270,638 B1   8/2001    Kaneko
(Continued)

FOREIGN PATENT DOCUMENTS

CN    104750140 A    7/2015
CN    107004626 A    8/2017
(Continued)

OTHER PUBLICATIONS

Taiwanese Office Action for Taiwanese Applicaiton No. 109121265 dated Jan. 5, 2024.
(Continued)

*Primary Examiner* — Monica D Harrison (57) ABSTRACT

A system to process a semiconductor substrate includes a substrate support assembly configured to support the semiconductor substrate. The substrate support assembly includes M resistive heaters respectively arranged in M zones in a layer of the substrate support assembly, where M is an integer greater than 1. The layer is adjacent to the semiconductor substrate. The substrate support assembly includes N temperature sensors arranged at N locations in the layer, where N is an integer greater than 1 and less than or equal to M. The system further includes a controller configured to control one or more of the M resistive heaters based on a temperature sensed by one of the N temperature sensors and average temperatures of one or more of the M zones.

23 Claims, 7 Drawing Sheets

(58) Field of Classification Search
USPC .......................................................... 438/758
See application file for complete search history.

(56) References Cited

U.S. PATENT DOCUMENTS

| | | | |
|---|---|---|---|
| 10,475,687 | B2 | 11/2019 | Kosakai et al. |
| 10,633,742 | B2 * | 4/2020 | Durbin .................... C23C 16/46 |
| 2002/0177094 | A1 | 11/2002 | Shirakawa |
| 2017/0215230 | A1 | 7/2017 | Parkhe |
| 2017/0372928 | A1 | 12/2017 | Yamada et al. |

FOREIGN PATENT DOCUMENTS

| | | |
|---|---|---|
| CN | 107546150 A | 1/2018 |
| JP | 2000339039 A | 12/2000 |
| JP | 2002313900 A | 10/2002 |
| JP | 2002353110 A | 12/2002 |
| JP | 2014110378 A | 6/2014 |
| JP | 2017163157 A | 9/2017 |
| JP | 2017216440 A | 12/2017 |
| KR | 20180046946 A | 5/2018 |
| KR | 101870657 B1 | 6/2018 |
| TW | 201806441 A | 2/2018 |
| WO | WO-2017188189 A1 | 11/2017 |

OTHER PUBLICATIONS

Chinese Office Action for Chinese Application No. 202080058573.3 dated Dec. 26, 2023.
International Search Report and Written Opinion of the ISA issued in PCT/US2020/038874, mailed Oct. 6, 2020; ISA/KR.
Chinese Office Action for Chinese Application No. 202080058573.3 dated Aug. 28, 2024.
Japanese Office Action for Japanese Application No. 2021576541 dated Jul. 9, 2024.

* cited by examiner

TEMPERATURE CONTROL OF A MULTI-ZONE PEDESTAL

CROSS-REFERENCE TO RELATED APPLICATIONS

This application is a U.S. National Phase Application under 35 U.S.C. 371 of International Application No. PCT/US2020/038874, filed on Jun. 22, 2020, which claims the benefit of U.S. Provisional Application No. 62/865,621, filed on Jun. 24, 2019. The entire disclosures of the applications referenced above are incorporated herein by reference.

FIELD

The present disclosure relates generally to substrate processing systems and more particularly to temperature control of a multi-zone pedestal.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Examples of processes that may be performed on a substrate include, but are not limited to, chemical vapor deposition (CVD), plasma enhanced chemical vapor deposition (PECVD), atomic layer deposition (ALD), atomic layer etch (ALE), plasma enhanced atomic layer deposition (PEALD) and/or other etch, deposition, and cleaning processes. During processing, a substrate is arranged on a substrate support, such as a pedestal, an electrostatic chuck (ESC), etc. in a processing chamber of the substrate processing system. A process gas mixture is introduced into the processing chamber to treat the substrate. In some examples, plasma may be struck to enhance chemical reactions within the processing chamber.

During substrate processing, the temperature of the substrate may be controlled by resistance heaters that are arranged in the substrate support. In some examples, the resistance heaters are arranged into two or more zones that are controlled separately. Maintaining thermal uniformity in the zones that are heated by the resistance heaters usually requires either direct temperature measurement in each zone or individually calibrated indirect temperature measurement (e.g., via a known dependence of heater resistance with temperature).

SUMMARY

A system to process a semiconductor substrate comprises a substrate support assembly configured to support the semiconductor substrate. The substrate support assembly includes M resistive heaters respectively arranged in M zones in a layer of the substrate support assembly, where M is an integer greater than 1. The layer is adjacent to the semiconductor substrate. The substrate support assembly includes N temperature sensors arranged at N locations in the layer, where N is an integer greater than 1 and less than or equal to M. The system further comprises a controller configured to control one or more of the M resistive heaters based on a temperature sensed by one of the N temperature sensors and average temperatures of one or more of the M zones.

In other features, the M zones include a first circular zone located at a center region of the layer, a second annular zone surrounding the first circular zone, a first set of zones located in a first annular region surrounding the second annular zone, and a second set of zones located in a second annular region surrounding the first annular region.

In another feature, the first set of zones is rotated at an angle relative to the second set of zones.

In another feature, the first set of zones is rotated at a forty five degree angle relative to the second set of zones.

In another feature, the first and second annular regions have different widths.

In another feature, the second annular zone has a different width than each of the first and second annular regions.

In another feature, each of the first and second sets of zones includes four zones.

In other features, the N temperature sensors include a first temperature sensor located in the first circular zone, a first pair of temperature sensors located at a first boundary between the second annular zone and the first set of zones along a first diameter of the layer, and a second pair of temperature sensors located at a second boundary between the first set of zones and the second set of zones along a second diameter of the layer. The first temperature sensor is located at an intersection of the first and second diameters.

In other features, locations of the first and second pairs of temperature sensors correspond to vertices of a parallelogram, and the first and second diameters form diagonals of the parallelogram.

In another feature, the controller is configured to control one of the M resistive heaters independently of others of the M resistive heaters.

In another feature, the controller is configured to control one or more of the M resistive heaters based on a target temperature profile of the semiconductor substrate.

In still other features, a substrate support assembly to support a semiconductor substrate comprises a baseplate including a layer adjacent to the semiconductor substrate. The substrate support assembly comprises M resistive heaters respectively arranged in M zones in the layer, where M is an integer greater than 1. The M zones include a first circular zone located at a center region of the layer, a second annular zone surrounding the first circular zone, a first set of zones located in a first annular region surrounding the second annular zone, and a second set of zones located in a second annular region surrounding the first annular region. The substrate support assembly comprises N temperature sensors arranged at N locations in the layer, where N is an integer greater than 1 and less than or equal to M. The N temperature sensors include a first pair of temperature sensors located at a first boundary between the second annular zone and the first set of zones along a first diameter of the layer, a second pair of temperature sensors located at a second boundary between the first set of zones and the second set of zones along a second diameter of the layer, and a first temperature sensor located in the first circular zone at an intersection of the first and second diameters.

In other features, locations of the first and second pairs of temperature sensors correspond to vertices of a parallelogram, and the first and second diameters form diagonals of the parallelogram.

In another feature, the first set of zones is rotated at an angle relative to the second set of zones.

In another feature, the first set of zones is rotated at a forty five degree angle relative to the second set of zones.

In another feature, the first and second annular regions have different widths.

In another feature, the second annular zone has a different width than each of the first and second annular regions.

In another feature, each of the first and second sets of zones includes four zones.

In other features, a system comprises the substrate support assembly and a controller configured to control one or more of the M resistive heaters based on a temperature sensed by one of the N temperature sensors and average temperatures of one or more of the M zones.

In another feature, the controller is configured to control one of the M resistive heaters independently of others of the M resistive heaters.

In another feature, the controller is configured to control one or more of the M resistive heaters based on a target temperature profile of the semiconductor substrate.

In other features, a system comprises the substrate support assembly and a controller configured to control one or more of the M resistive heaters using a temperature sensed by one of the N temperature sensors in combination with open loop control of the M zones. The open loop control of the M zones includes correlating power supplied to each of the M zones to a measured temperature of the semiconductor substrate.

In other features, a system comprises the substrate support assembly and a controller configured to control a first resistive heater of the M resistive heaters relative to a second resistive heater of the M resistive heaters based on a temperature sensed by one of the N temperature sensors and a ratio of resistances of the first and second resistive heaters.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

While the present disclosure includes specific examples relating to temperature control of multiple zones in a substrate support of a substrate processing system, the systems and methods set forth herein can be applied to control of temperature in other types of components with zoned resistance heating.

In film deposition processes such as atomic layer deposition (ALD), properties of the deposited film vary across a spatial (i.e., x-y coordinates of a horizontal plane) distribution. For example, substrate processing tools may have respective specifications for film thickness non-uniformity (NU), which may be measured as a full-range, a half-range, and/or a standard deviation of a measurement set taken at predetermined locations on a surface of a semiconductor substrate. In some examples, the NU may be reduced by addressing a direct cause of the NU and/or introducing a counteracting NU to compensate and cancel the existing NU. In other examples, material may be intentionally deposited and/or removed non-uniformly to compensate for known non-uniformities at other (e.g., previous or subsequent) steps in a process. In these other examples, a predetermined non-uniform deposition/removal profile may be calculated and used.

Various properties of deposited ALD films may be influenced by a temperature of the substrate during deposition. Systems and methods according to the present disclosure are configured to adjust a temperature distribution across the substrate to reduce thickness NU. For example, the temperature distribution may be adjusted to compensate for a known NU of a particular substrate processing tool (called profile compensation), to generate a predetermined NU profile for use during a particular process (called profile tuning), etc.

For example, during an ALD process (e.g., deposition of an oxide film), a substrate is arranged on a substrate support such as an ALD pedestal. Typically, an ALD pedestal comprises a single zone. An ALD pedestal according to the present disclosure includes a multi-zone (e.g., from 2 to 10 or more zones) heater layer. The heater layer may be embedded within an upper layer of the pedestal. For example, the heater layer may comprise a polyimide and silicone heater layer that is at least partially enclosed in an aluminum upper layer (e.g., an upper layer configured to support/contact the substrate arranged on the substrate support). In this example, the arrangement of the aluminum upper layer may function as a Faraday cage. In other examples, the upper layer may be a ceramic layer (e.g., $Al_2O_3$, AlN, etc.). Each zone of the heater layer controls a temperature of a respective zone of the pedestal. The upper layer is arranged on a base (e.g., a baseplate) of the pedestal, and heat may be transferred from the upper layer to the baseplate, which may be cooled.

An arrangement (e.g., quantity, shape, geometry, etc.) of the zones is configured to compensate for known film thickness NUs resulting from an ALD process. The zones may include, but are not limited to: two or more radial (i.e., annular) zones having different widths; two or more segmented radial zones (i.e., radial zones including multiple segments/azimuthal zones); an outer radial zone that is adjacent to and/or overlaps an edge of the substrate; and an outer radial zone arranged to adjust a temperature of a carrier ring (e.g., to control/correct radial profiles for deposition and/or removal through trimming).

In one example, the zones include ten zones, including a central zone, an inner-mid radius zone, four outer-mid radius zones (i.e., an outer-mid radius zone comprising four segments), and four outer edge zones (i.e., an outer edge zone comprising four segments). In some examples, the radial zones may include more than four segments (e.g., eight or more). Further, the azimuthal zones of adjacent radial zones may not be aligned. Instead, the azimuthal zones of one radial zone may have a different rotational orientation (i.e., clocking) relative to adjacent radial zones.

Each of the zones includes a resistive heater. The resistive heater includes a resistive element made of a material having a high temperature coefficient of resistance (TCR). Accordingly, throughout the present disclosure, the resistive heaters are also called high TCR heaters or high TCR heater elements. In some examples, the heater element has a high TCR that is greater than 0.001 per degree Celsius. For example only, molybdenum, tungsten (W), copper, or nickel heater elements may be used. In other examples, the heater element has a lower TCR that is less than 0.001 per degree Celsius. For example only, stainless steel (SST) alloys can be used.

The temperatures of the heater zones are controlled (i.e., power supplied to the resistive heaters in the multiple zones is controlled) to achieve a target temperature profile (also called a heat map) for the substrate during processing. One method for controlling the temperatures of multiple zones is an open loop control that correlates power supplied to each zone to the measured temperature of the wafer. However, this method, when used alone, has a few disadvantages. For example, one disadvantage is that the open loop control lacks data regarding any load changes that may occur in the environment surrounding the wafer and that may cause a change in the substrate temperature. Another disadvantage is that when moving from one temperature set-point to another, the response time is slower than if a closed loop control is used. That is, when the power supplied to one or more zones is changed to effect a desired temperature change, the time taken for the actual temperature change to occur may be much slower than if a closed loop control is used.

In contrast, in a closed loop control (e.g., a PID control), the power supplied to each zone is controlled using a feedback loop, which provides two benefits. First, the closed loop control makes the temperature control more robust to other stimuli (e.g., any load changes) than the open loop control; and second, when moving from one temperature set-point to another, the response time is faster than the open loop control. That is, when the power supplied to one or more zones is changed to effect a desired temperature change, the time taken for the actual temperature change to occur is faster than in the open loop control.

Using multiple zones in the pedestal, with each zone having a thermocouple (TC), may be sufficient to control the temperature distribution on the wafer if there is correlation between the temperature of the wafer and the TCs. Instead, a minimum number of TCs that provide local temperatures of selected zones and average temperatures of the zones can be used to control the temperature distribution on the wafer as explained below.

The present disclosure relates to a temperature control scheme that combines local temperature measurements of pedestal surface (e.g., using TCs or resistance thermometers, also called resistance temperature detectors (RTDs)) with average temperatures of zones or with open loop control as described below. Specifically, the proposed temperature control scheme combines local temperature measurements (e.g., using TCs or RTD or similar methods) in less than all the zones with open loop current/voltage control on the zones without TCs included in them. A TC provides a local temperatures of a zone, which represents a temperature at a point location in the zone. In addition, average temperature measurements of heater elements in the zones are used to accurately set pedestal surface temperature to a prescribed temperature profile when combined with the local temperature measurements.

A high TCR based method of measuring average zone temperatures can be used with multiple (e.g., 10) zones and can provide the ability for a closed loop control for all the zones. In the high TCR based method, a resistance of a high TCR heater element in a zone can be measured. The resistance can be correlated to temperature using a lookup table or formula to provide an average temperature in the zone. The high TCR based method can provide average temperatures of the zones, which can be used as is or combined with the local temperature measurements. These and other aspects of the present disclosure are described below in detail.

Figure 1A:
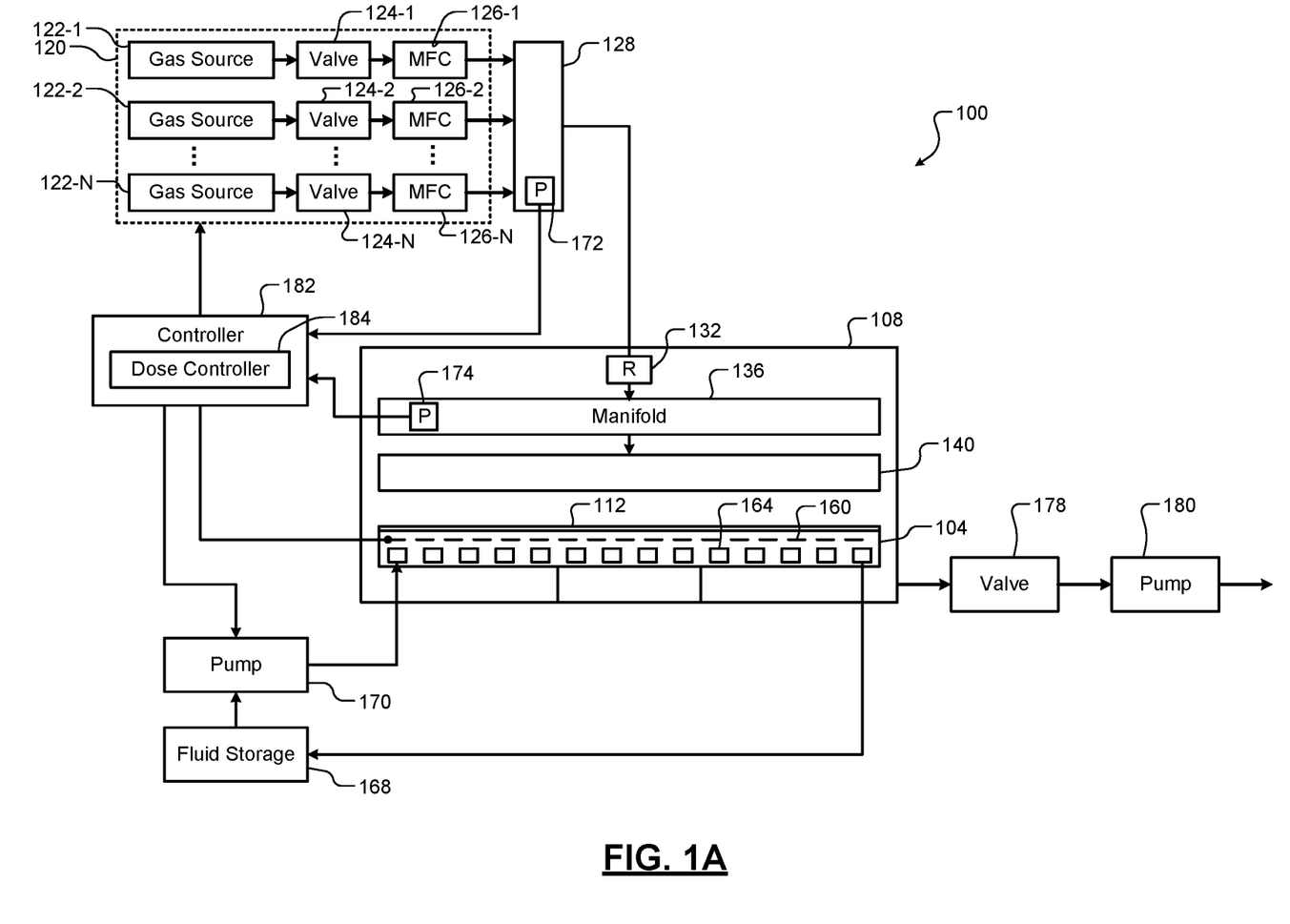
FIG. 1A is a functional block diagram of an example of a substrate processing system.
Figure 1B:
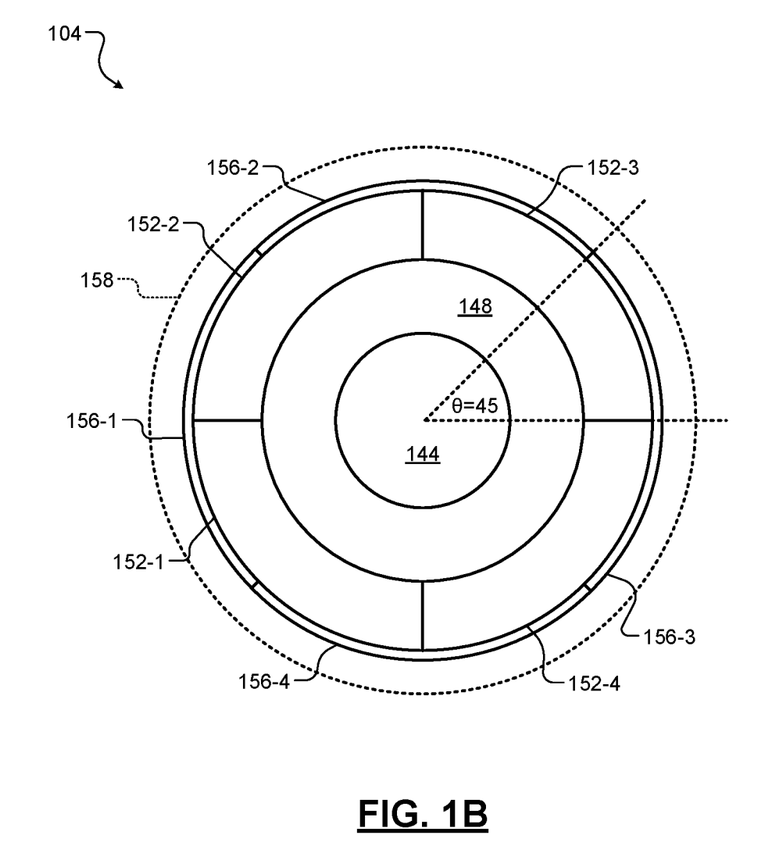
FIG. 1B shows heater zones of a substrate support according to the present disclosure.

Referring now to FIGS. 1A and 1B, an example of a substrate processing system 100 including a substrate support (e.g., an ALD pedestal) 104 according to the present disclosure is shown. The substrate support 104 is arranged within a processing chamber 108. A substrate 112 is arranged on the substrate support 104 during processing. In some examples, the substrate support 104 may be configured to minimize contact with the substrate 112 (e.g., only an outer edge of the substrate 112 may contact an upper surface of the substrate support 104, the substrate 112 may be arranged on minimum contact area (MCA) features, etc.). In other examples, the substrate support 104 may be configured to provide backside gas clamping.

A gas delivery system 120 includes gas sources 122-1, 122-2, ..., and 122-N (collectively gas sources 122) that are connected to valves 124-1, 124-2, ..., and 124-N (collectively valves 124) and mass flow controllers 126-1, 126-2, ..., and 126-N (collectively MFCs 126). The MFCs 126 control flow of gases from the gas sources 122 to a manifold 128 where the gases mix. An output of the manifold 128 is supplied via an optional pressure regulator 132 to a manifold 136. An output of the manifold 136 is input to a multi-injector showerhead 140. While the manifolds 128 and 136 are shown, a single manifold can be used.

The substrate support 104 includes a plurality of zones. For example, as shown in FIG. 1B, the substrate support 104 includes a central zone 144, an inner-mid radius zone 148, four outer-mid radius zones (i.e., an outer-mid radius zone 152 comprising four segments 152-1, 152-2, 152-3, and 152-4), and four outer edge zones (i.e., an outer edge zone 156 comprising four segments 156-1, 156-2, 156-3, and 156-4). The segments of the outer edge zone 156 are offset from (i.e., rotated with respect to) the segments of the outer-mid radius zone 152 (e.g., by 45°). In some examples, the substrate support 104 may include a second outer edge zone 158 radially outside of the outer edge zone 156. For example, an inner diameter of the second outer edge zone 158 may be greater than a diameter of the substrate 112. A temperature of the substrate support 104 may be controlled by using separately-controllable resistive heaters 160 arranged in respective ones of the zones as described below.

In some examples, the outer edge zone 156 may overlap and/or extend beyond (i.e., in a radial direction) an outer edge of the substrate 112. For example, for a 300 mm substrate, the radius of the outer edge zone 156 may be greater than 300 mm. Further, a width of the outer edge zone 156 (i.e., a distance from an inner radius to an outer radius) may be less than a width of the inner-mid radius zone 148 and the outer-mid radius zone 152. For example, the width of the outer edge zone 156 may be approximately 10 mm (e.g., +/−2 mm) while the respective widths of the inner-mid radius zone 148 and the outer-mid radius zone 152 may be approximately 40 mm (e.g., +/−2 mm). The relatively narrow width of the outer edge zone 156 can facilitate fine tuning at the outer edge of the substrate 112.

In some examples, the substrate support 104 may include coolant channels 164. Cooling fluid is supplied to the coolant channels 164 from a fluid storage 168 and a pump 170. Pressure sensors 172, 174 may be arranged in the manifold 128 or the manifold 136, respectively, to measure pressure. A valve 178 and a pump 180 may be used to evacuate reactants from the processing chamber 108 and/or to control pressure within the processing chamber 108.

A controller 182 includes a dose controller 184 that controls dosing provided by the multi-injector showerhead 140. The controller 182 also controls gas delivery from the gas delivery system 120. The controller 182 controls pressure in the processing chamber and/or evacuation of reactants using the valve 178 and the pump 180. The controller 182 controls the temperature of the substrate support 104 and the substrate 112 as described below.

Figure 2:
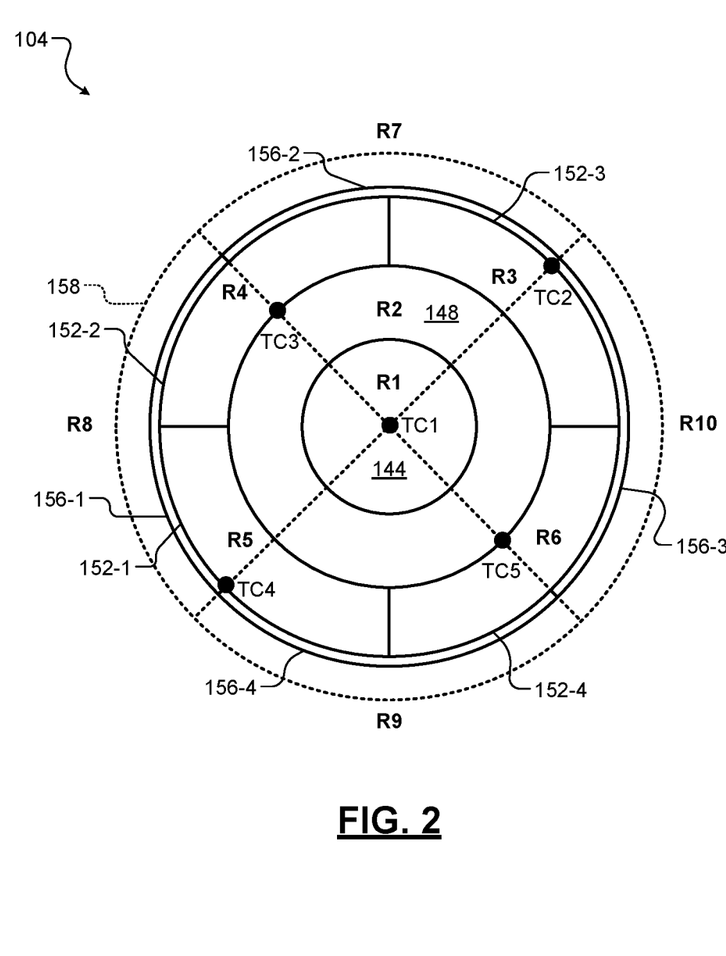
FIG. 2 shows temperature sensors arranged in the heater zones shown in FIG. 1B.

FIG. 2 shows the radial zones of the pedestal. The radial zones are labeled as R1, R2, . . . , and R10. Thermocouples TC1, TC2, . . . , and TC5 (depicted by solid circles) are arranged as shown. While TCs are used for illustrative purposes throughout the present disclosure, it is understood that RTDs can be used instead of or in combination with TCs. Specifically, TC1 is located at a center of the center zone R1 (element 144). Thermocouples TC2, TC3, TC4, and TC5 are arranged at boundaries between the radial zones in a cross pattern as shown.

Specifically, two thermocouples TC3 and TC5 are arranged at diametrically opposite ends on a boundary between the radial zone R2 (element 148) and the radial zones R3, R4, R5, and R6 (elements 152) in a cross pattern as shown. The two thermocouples TC3 and TC5 may lie along a first diameter of the pedestal that passes through the centers of the radial zones R4 and R6 as shown. The first diameter also passes through a joint of the radial zones R7 and R8 and through a joint of the radial zones R9 and R10 as shown. The two thermocouples TC3 and TC5 may be respectively adjacent or closer to the centers of the radial zones R4 and R6 as shown.

The other two thermocouples TC2 and TC4 are arranged at diametrically opposite ends on a boundary between the radial zones R3, R4, R5, and R6 (elements 152) and the radial zones R7, R8, R9, and R10 (elements 156) in a cross pattern as shown. The other two thermocouples TC2 and TC4 may lie along a second diameter of the pedestal that passes through the centers of the radial zones R3 and R5 as shown. The second diameter also passes through a joint of the radial zones R7 and R10 and through a joint of the radial zones R8 and R9 as shown. The thermocouple TC2 may be located at the joint of radial zones R7 and R10, and the thermocouple TC4 may be located at the joint of the radial zones R8 and R9 as shown.

For example, the first and second diameters of the pedestal may intersect at an angle of ninety degrees or another angle. For example, the thermocouples TC2, TC3, TC4, and TC5 may lie at vertices of a parallelogram; and the first and second diameters form the diagonals of the parallelogram. The thermocouple TC1 may lie at the intersection of the first and second diameters as shown.

When arranged in this manner, the thermocouples TC1, TC2, . . . , and TC5 can capture inter-zone thermal interactions and local temperatures at two different diameters of the pedestal. With the average temperature of each zone obtained from the high TCR heater elements and local temperatures of selected zones obtained from the TCs in the selected zones, a heat map for all the zones can be constructed. Further, a target temperature distribution across the wafer can be achieved by controlling the heater elements using a combination of the local temperatures of the selected zones and the average temperature of each zone.

Calibration (i.e., determination of temperature to resistance correspondence) of the high TCR heaters can be performed using the local temperature measurements. For example, in an open loop calibration method, the power input to the zones R1 through R10 is increased in sequence (i.e., R1, then R2, then R3, and so on) by X %, and wafer temperatures are measured. A sensitivity measurement of wafer temperature to power value of each zone (e.g., dT/dp, where T denotes the wafer temperature; and p denotes power in terms of voltage, current, or both) is defined. While collecting the wafer temperature data, the average temperature of each zone is also measured in parallel, and a sensitivity measurement of the wafer temperature to the average temperature of each zone $dT/dT_{heater-element}$ is defined. Another sensitivity measurement of the average zone temperature to the power value of each zone $dT_{heater-element}/dp$ can also be defined. Accordingly, the control variable can be the power supplied to each zone or the average temperature of the zone. By controlling either or both, the temperature of the wafer can be controlled.

Whether to use the average zone temperature as an additional (i.e., auxiliary) control variable (for improved targeting of a wafer temperature distribution profile) or as a primary control variable may be time dependent. In steady state, the temperature of the wafer can be controlled using open loop control. When switching states (e.g., due to a load change), the average zone temperature may be used as the primary control variable. The average temperature for a zone can be obtained by analyzing resistance-temperature relationship data from the high-TCR heater element in the zone. For example, the average temperature may be an area weighted average where the area is of the high-TCR heater element.

In some situations, the overhead of computing the average zone temperatures can be avoided. For example, if the average zone temperature is to be used as an auxiliary variable (e.g., for transient response), a ratio of resistances of heater elements in two zones can be used to increase or decrease power supplied to the heater element in one of the two zones, instead of using the average temperatures of the two zones as explained below.

Several methods can be used to control the wafer temperature. For example, the least complex method involves controlling the power supplied to each zone based on the average temperature of each zone. The most complex method involves defining a least mean squares (LMS) temperature target for the entire heat map, and controlling the power supplied to each zone using pulse width modulation (PWM).

In a hybrid method of moderate complexity, a minimum number of TCs are used in combination with the average zone temperatures to control specific zones. In a fourth method, the temperature of the zones can be controlled using open loop control in steady state; and the average zone temperature may be used as the primary control variable when switching states (e.g., when load changes).

Some examples of the hybrid method follow. In one example, in FIG. 2, TC1, TC2, and TC3 can control inputs for zones R1, R2, and baseline for all outer zones, respectively. The average zone temperature is used as an input for controlling resistance ratio between zones. The resistance ratio between zones is controlled using open loop control.

For example, consider the outer zones R7, R8, R9, and R10. These zones have the same area. Suppose the resistances of the heater elements in these zones are equal. If these zones are to have the same target temperature, one of the zones, say R8, is driven using the local temperature of the zone R8 to the target temperature. Zones R7, R9, and R10 are driven to the same resistance value corresponding to the target temperature. Assuming that these zones were initially at the same resistance value when cold or in steady state, after heating, if the zones are at the same resistance when hot, the zones will be at the same temperature (i.e., the target temperature).

Now suppose that zone R10 is to be hotter than zone R8. If the temperature ratio to be achieved between the zones R8 and R10 is known, zone R10 can be driven so as to have a lower resistance value than zone R8 so that the ratio of resistances of zones R8 and R10 corresponds to the ratio of temperatures of the zones R8 and R10. Accordingly, when switching states (e.g., when load changes), in addition to using a minimum number of TCs (local temperature measurements) to control specific zones, the average zone temperatures can be used to control resistance ratios between the zones in the azimuthal direction. In another example of the hybrid method, TC5 could control zone R6 while the average zone temperature could control zone R2.

Figure 3A:
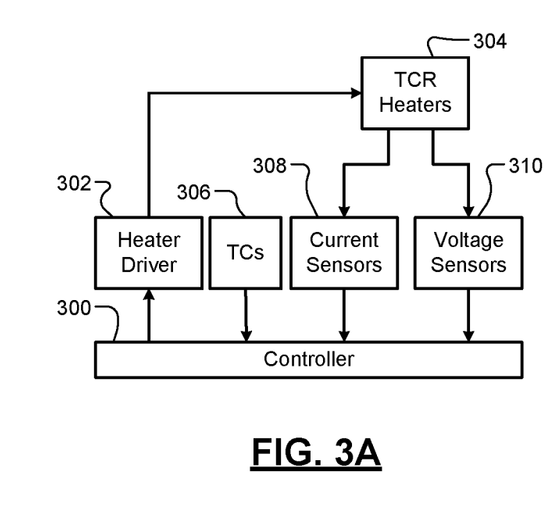
FIGS. 3A and 3B show functional block diagrams of examples of heating systems according to the present disclosure.

FIG. 3A shows a controller 300 that may be used to control the heater zones R1 through R10 shown in FIG. 2. For example, the controller 300 may be implemented by the controller 182 shown in FIG. 1A. A heater driver 302 may be used to supply power to selected TCR heaters 304 under the control of the controller 300. For example, the TCR heaters 304 may be used to implement the resistive heaters 160 (shown in FIG. 1A). Current sensors 308 may be used to sense current supplied to the TCR heaters 304 by the heater driver 302. Voltage sensors 310 may be used to sense voltage supplied to the TCR heaters 304 by the heater driver 302. The controller 300 determines the resistance of each of the TCR heaters 304 based on the respective current and/or voltage measurements from the current sensors 308 and/or the voltage sensors 310.

Figure 3B:
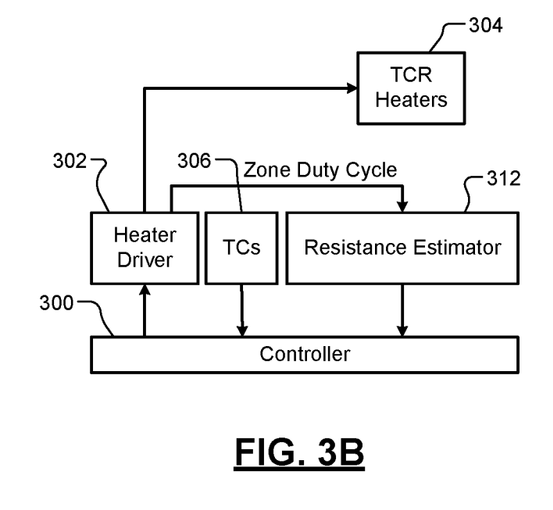

FIG. 3B shows that the controller 300 uses a resistance estimator 312 to monitor duty cycles of the heater zones and to estimate the resistance of the heater zones based on the corresponding duty cycle. In this example, it is assumed that the voltage or current is a constant value, and the duty cycle of the current or voltage is varied. In other words, the controller 300 estimates resistance based on the known voltage or current and the duty cycle for the current or voltage. Accordingly, in this example, the current sensors 308 and the voltage sensors 310 are omitted.

In FIGS. 3A and 3B, the controller 300 controls the TCR heaters 304 in the heater zones R1-R10. The controller 300 selects a heater zone (e.g., any zone R1, R2, and so on shown in FIG. 2). The heater driver 302 supplies power to the selected TCR heater 304. The operations of the controller 300 and other components of FIGS. 3A and 3B are described below in detail with reference to FIGS. 5 and 6.

Figure 4:
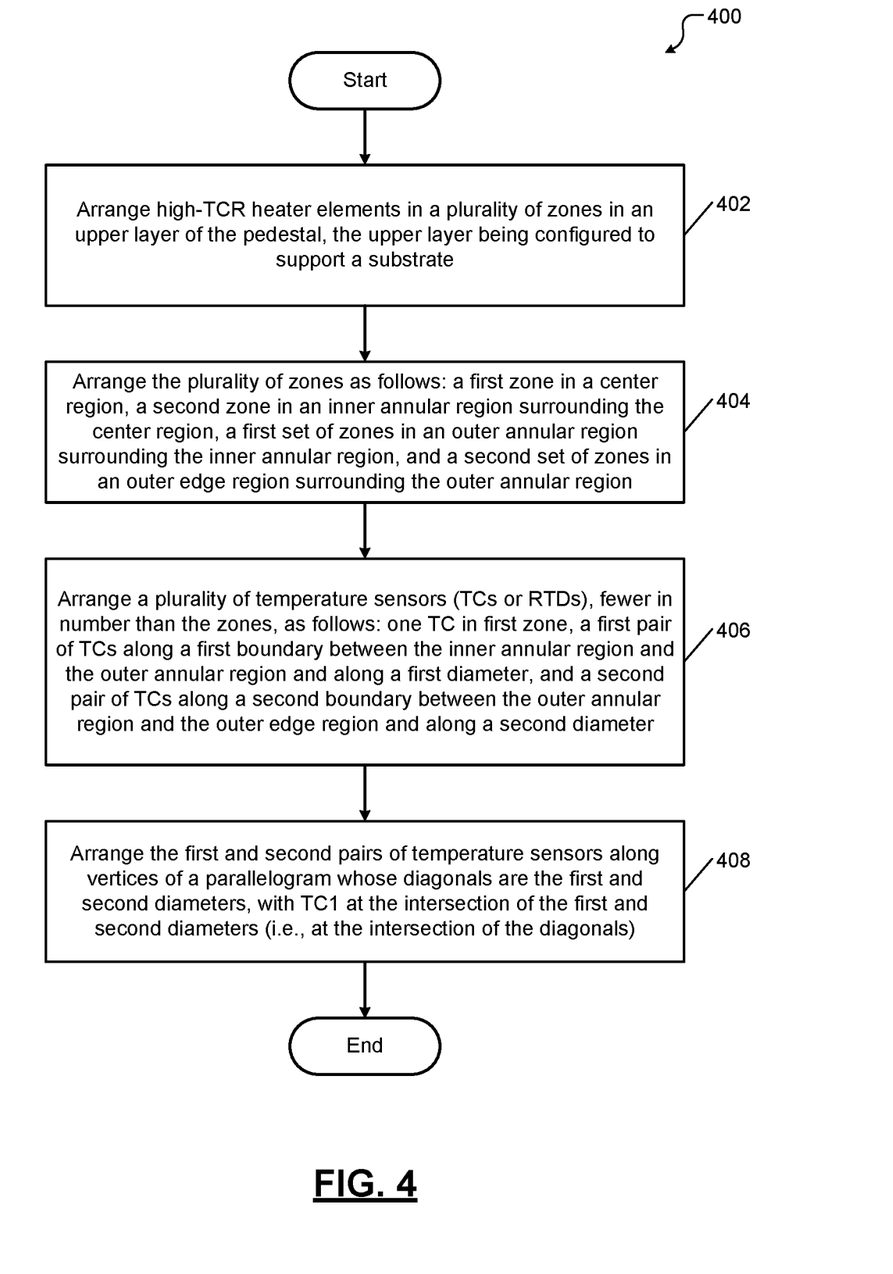
FIG. 4 is a flowchart of a method for arranging the heater zones and temperature sensors according to the present disclosure.

FIG. 4 shows a method 400 for arranging a plurality of zones (and respective heaters) and temperature sensors (e.g., TCs and/or RTDs) according to the present disclosure. At 402, the method 400 includes arranging high TCR heater elements in a plurality of zones in an upper layer of the pedestal, where the upper layer of the pedestal is configured to support a substrate during processing. At 404, the method 400 includes arranging the plurality of zones as follows. The zones include a first zone in a center region of the upper layer of the pedestal (e.g., zone R1 144 shown in FIGS. 1B and 2), a second zone in an inner annular region surrounding the center region (e.g., zone R2 148 shown in FIGS. 1B and 2), a first set of zones in an outer annular region surrounding the inner annular zone (e.g., zones R3, R4, R5, and R6 or zones 152 shown in FIGS. 1B and 2), and a second set of zones in an outer edge region surrounding the outer annular region (e.g., zones R7, R8, R9, and R10 or zones 156). The second set of zones may be offset by an angle (e.g., 45 degrees) relative to the first set of zones (e.g., as shown in FIG. 1B).

At 406, the method 400 includes arranging a plurality of temperature sensors (e.g., TCs and/or RTDs), fewer in number than the number of zones, as follows. One TC is arranged in the first zone (e.g., TC1 in zone R1 144 shown in FIG. 2). A first pair of TCs (TC3 and TC5 shown in FIG. 2) is arranged along a first boundary between the inner annular region (zone R2 148) and the outer annular region (zones 152) and along a first diameter. A second pair of TCs (TC2 and TC4 shown in FIG. 2) is arranged along a second boundary between the outer annular region (zones 152) and the outer edge region (zones 156) and along a second diameter.

At 408, the method 400 includes arranging the first and second pairs of temperature sensors along vertices of a parallelogram whose diagonals are the first and second diameters. TC1 is arranged at the intersection of the first and second diameters (i.e., at the intersection of the diagonals).

Figure 5:
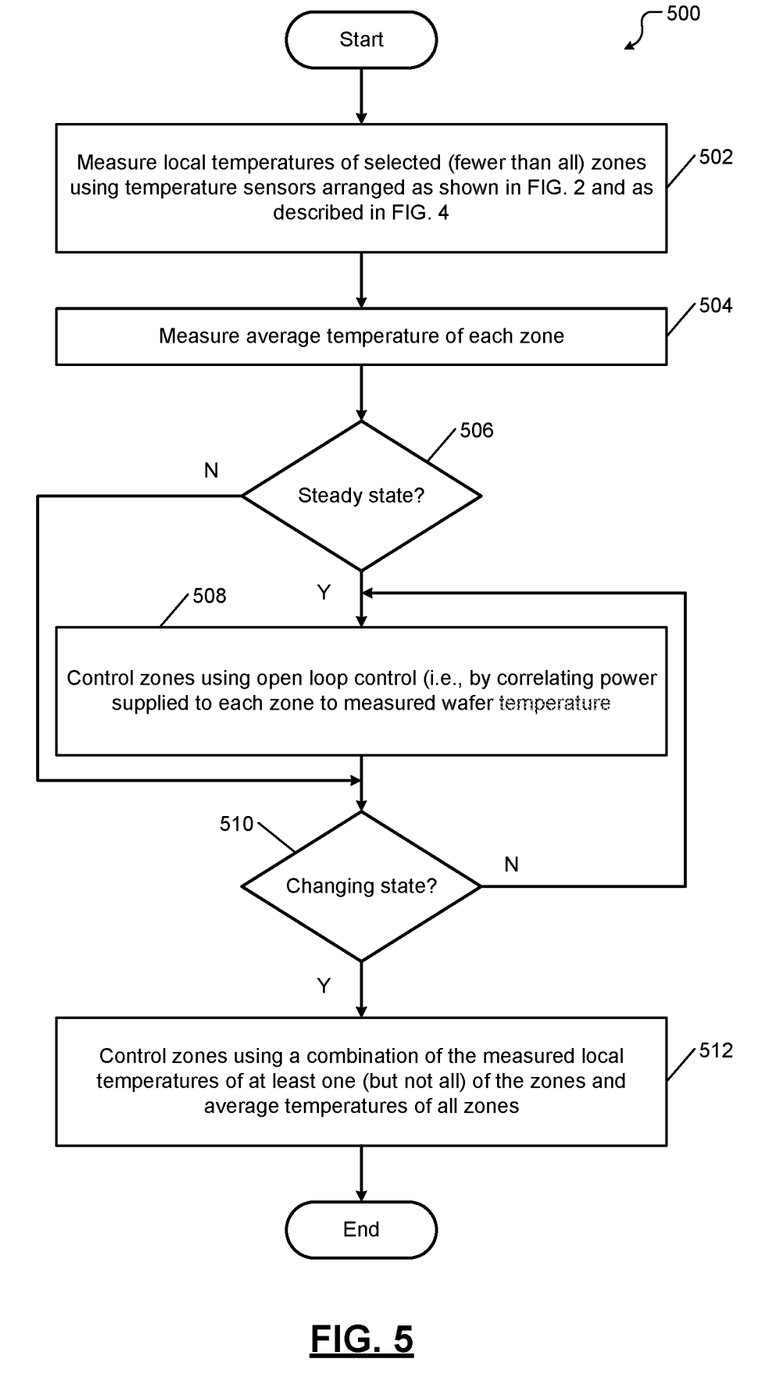
FIG. 5 is a flowchart of a first method for controlling the heater zones according to the present disclosure.

FIG. 5 shows a first method 500 for controlling the zones (e.g., R1-R10 shown in FIGS. 1B and 2) according to the present disclosure. The method 500 is performed by the controller 300 and other components shown in FIGS. 3A and 3B. At 502, the method 500 measures local temperatures of selected (fewer than all) zones using temperature sensors arranged as shown in FIG. 2 and as described with reference to FIG. 4. At 504, the method 500 measures the average temperature of each zone.

At 506, the method 500 determines whether the zones are in a steady state. At 508, when the zones are in a steady state, the method 500 controls the zones using open loop control (i.e., by correlating power supplied to each zone to the measured wafer temperature).

At 510, the method 500 determines whether one or more zones need to change state (e.g., due to a change in load). The method 500 returns to 508 if one or more zones do not need to change state (i.e., if the zones are in a steady state). At 512, if one or more zones need to change state, the method 500 controls power supplied to the one or more zones using a combination of the measured local temperatures of at least one (but not all) of the zones and the average temperatures of all the zones.

Figure 6:
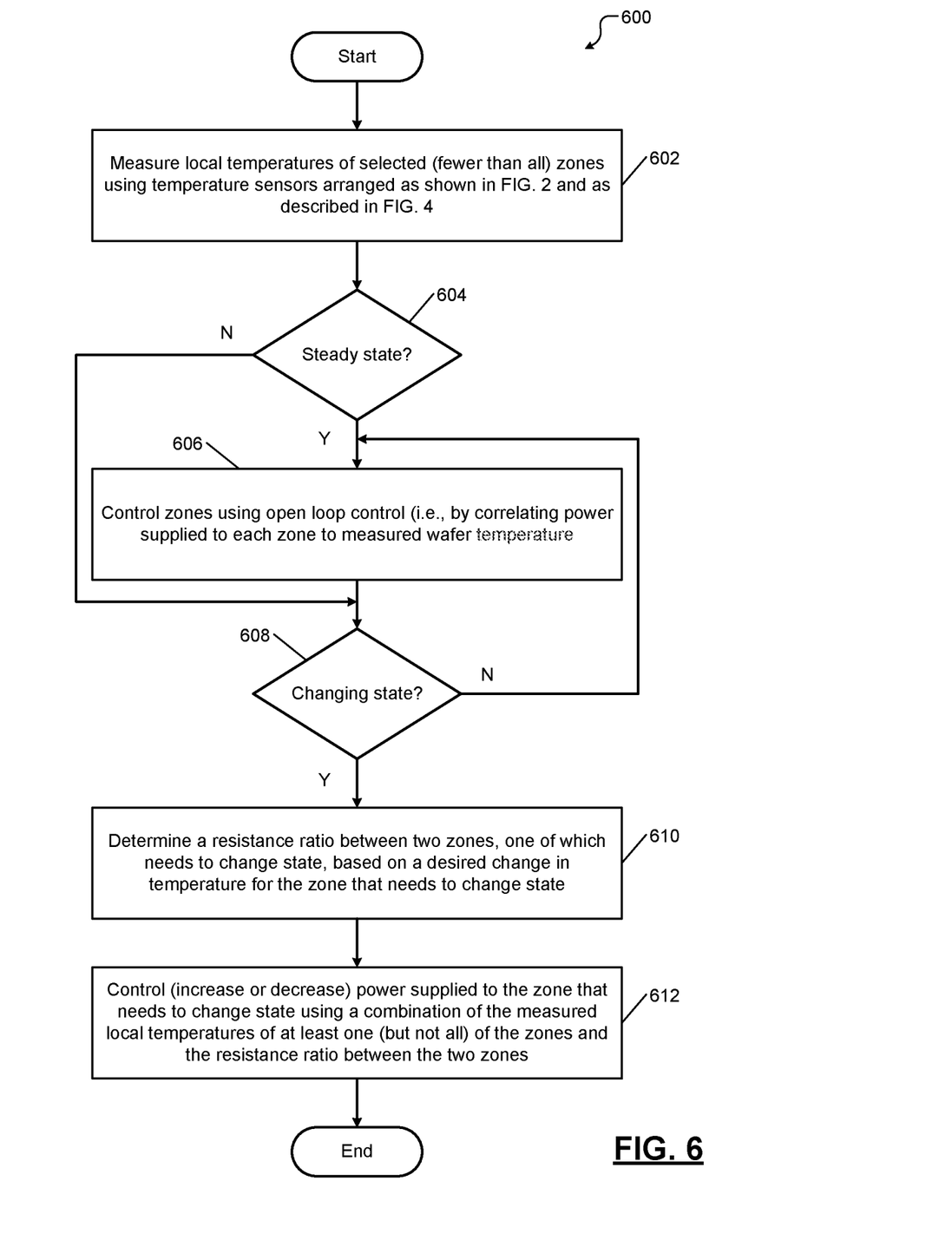
FIG. 6 is a flowchart of a second method for controlling the heater zones according to the present disclosure.

FIG. 6 shows a second method 600 for controlling the zones (e.g., R1-R10 shown in FIGS. 1B and 2) according to the present disclosure. The method 600 is performed by the controller 300 and other components shown in FIGS. 3A and 3B. At 602, the method 600 measures local temperatures of selected (less than all) zones using temperature sensors arranged as shown in FIG. 2 and as described with reference to FIG. 4.

At 604, method 600 determines whether the zones are in a steady state. At 606, when the zones are in a steady state, the method 600 controls the zones using open loop control (i.e., by correlating power supplied to each zone to the measured wafer temperature).

At 608, the method 600 determines whether one or more zones need to change state (e.g., due to a change in load). The method 600 returns to 606 if one or more zones do not need to change state (i.e., if the zones are in a steady state).

At 610, if one or more zones need to change state, the method 600 determines a resistance ratio between two zones, one of which needs to change state, based on a desired change in temperature for the zone that needs to change state.

At 612, the method 600 controls power supplied to the zone that needs to change state using a combination of the measured local temperatures of at least one (but not all) of the zones and the resistance ratio between the two zones. Accordingly, power to the zone that needs to change state is increased or decreased based on the combination of the measured local temperatures of at least one (but not all) of the zones and the resistance ratio between the two zones.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems.

The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software).

Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system to process a semiconductor substrate, comprising:
   a substrate support assembly configured to support the semiconductor substrate, including:
      M resistive heaters respectively arranged in M zones in a layer of the substrate support assembly, the layer being adjacent to the semiconductor substrate, where M is an integer greater than 1; and
      N temperature sensors arranged at N locations in the layer, where N is an integer greater than 1 and less than or equal to M; and
   a controller configured to control one or more of the M resistive heaters based on a temperature sensed by one of the N temperature sensors and average temperatures of one or more of the M zones.

2. The system of claim 1 wherein the M zones include:
   a first circular zone located at a center region of the layer;
   a second annular zone surrounding the first circular zone;
   a first set of zones located in a first annular region surrounding the second annular zone; and
   a second set of zones located in a second annular region surrounding the first annular region.

3. The system of claim 2 wherein the first set of zones is rotated at an angle relative to the second set of zones.

4. The system of claim 2 wherein the first set of zones is rotated at a forty five degree angle relative to the second set of zones.

5. The system of claim 2 wherein the first and second annular regions have different widths.

6. The system of claim 2 wherein the second annular zone has a different width than each of the first and second annular regions.

7. The system of claim 2 wherein each of the first and second sets of zones includes four zones.

8. The system of claim 2 wherein the N temperature sensors include:
   a first temperature sensor located in the first circular zone;
   a first pair of temperature sensors located at a first boundary between the second annular zone and the first set of zones along a first diameter of the layer; and
   a second pair of temperature sensors located at a second boundary between the first set of zones and the second set of zones along a second diameter of the layer,
   wherein the first temperature sensor is located at an intersection of the first and second diameters.

9. The system of claim 8 wherein:
   locations of the first and second pairs of temperature sensors correspond to vertices of a parallelogram; and
   the first and second diameters form diagonals of the parallelogram.

10. The system of claim 1 wherein the controller is configured to control one of the M resistive heaters independently of others of the M resistive heaters.

11. The system of claim 1 wherein the controller is configured to control one or more of the M resistive heaters based on a target temperature profile of the semiconductor substrate.

12. A substrate support assembly to support a semiconductor substrate, comprising:
   a baseplate including a layer adjacent to the semiconductor substrate;
   M resistive heaters respectively arranged in M zones in the layer, where M is an integer greater than 1, and wherein the M zones include:
      a first circular zone located at a center region of the layer;
      a second annular zone surrounding the first circular zone;
      a first set of zones located in a first annular region surrounding the second annular zone; and
      a second set of zones located in a second annular region surrounding the first annular region; and
   N temperature sensors arranged at N locations in the layer, where N is an integer greater than 1 and less than or equal to M, and wherein the N temperature sensors include:
      a first pair of temperature sensors located at a first boundary between the second annular zone and the first set of zones along a first diameter of the layer;
      a second pair of temperature sensors located at a second boundary between the first set of zones and the second set of zones along a second diameter of the layer; and
      a first temperature sensor located in the first circular zone at an intersection of the first and second diameters.

13. The substrate support assembly of claim 12 wherein:
   locations of the first and second pairs of temperature sensors correspond to vertices of a parallelogram; and
   the first and second diameters form diagonals of the parallelogram.

14. The substrate support assembly of claim 12 wherein the first set of zones is rotated at an angle relative to the second set of zones.

15. The substrate support assembly of claim 12 wherein the first set of zones is rotated at a forty five degree angle relative to the second set of zones.

16. The substrate support assembly of claim 12 wherein the first and second annular regions have different widths.

17. The substrate support assembly of claim 12 wherein the second annular zone has a different width than each of the first and second annular regions.

18. The substrate support assembly of claim 12 wherein each of the first and second sets of zones includes four zones.

19. A system comprising:
   the substrate support assembly of claim 12; and
   a controller configured to control one or more of the M resistive heaters based on a temperature sensed by one of the N temperature sensors and average temperatures of one or more of the M zones.

20. The system of claim 19 wherein the controller is configured to control one of the M resistive heaters independently of others of the M resistive heaters.

21. The system of claim 19 wherein the controller is configured to control one or more of the M resistive heaters based on a target temperature profile of the semiconductor substrate.

22. A system comprising:
the substrate support assembly of claim 12; and
a controller configured to control one or more of the M resistive heaters using a temperature sensed by one of the N temperature sensors in combination with open loop control of the M zones,
wherein the open loop control of the M zones includes correlating power supplied to each of the M zones to a measured temperature of the semiconductor substrate.

23. A system comprising:
the substrate support assembly of claim 12; and
a controller configured to control a first resistive heater of the M resistive heaters relative to a second resistive heater of the M resistive heaters based on a temperature sensed by one of the N temperature sensors and a ratio of resistances of the first and second resistive heaters.

* * * * *